(12) United States Patent
Press et al.

(10) Patent No.: US 7,745,334 B2
(45) Date of Patent: Jun. 29, 2010

(54) TECHNIQUE FOR LOCALLY ADAPTING TRANSISTOR CHARACTERISTICS BY USING ADVANCED LASER/FLASH ANNEAL TECHNIQUES

(75) Inventors: Patrick Press, Dresden (DE); Karla Romero, Dresden (DE); Martin Trentzsch, Dresden (DE); Karsten Wieczorek, Dresden (DE); Thomas Feudel, Radebeul (DE); Markus Lenski, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 205 days.

(21) Appl. No.: 11/736,939

(22) Filed: Apr. 18, 2007

(65) Prior Publication Data
US 2008/0081471 A1 Apr. 3, 2008

(30) Foreign Application Priority Data
Sep. 29, 2006 (DE) .................. 10 2006 046 376

(51) Int. Cl.
*H01L 21/302* (2006.01)
*H01L 21/461* (2006.01)
(52) U.S. Cl. ............. 438/682; 438/799; 257/E21.619; 257/E21.473; 257/E21.593
(58) Field of Classification Search ............ 438/682, 438/674, 670, 799, 677; 257/E21.619, E21.634, 257/E21.593, E21.473
See application file for complete search history.

(56) References Cited

U.S. PATENT DOCUMENTS

| | | | | |
|---|---|---|---|---|
| 6,060,392 A | * | 5/2000 | Essaian et al. | 438/682 |
| 6,156,654 A | * | 12/2000 | Ho et al. | 438/683 |
| 6,297,135 B1 | * | 10/2001 | Talwar et al. | 438/592 |
| 6,365,476 B1 | | 4/2002 | Talwar et al. | 438/308 |
| 6,387,803 B2 | | 5/2002 | Talwar et al. | 438/682 |
| 2002/0161468 A1 | * | 10/2002 | Liu | 700/117 |
| 2003/0017721 A1 | * | 1/2003 | Powell | 438/795 |
| 2003/0040130 A1 | * | 2/2003 | Mayur et al. | 438/14 |
| 2003/0148574 A1 | * | 8/2003 | Thomas et al. | 438/201 |
| 2004/0029348 A1 | * | 2/2004 | Lee | 438/299 |
| 2005/0003621 A1 | * | 1/2005 | Nakaoka et al. | 438/301 |
| 2005/0112854 A1 | * | 5/2005 | Ito et al. | 438/527 |
| 2005/0156208 A1 | * | 7/2005 | Lin et al. | 257/288 |
| 2005/0253166 A1 | | 11/2005 | Ke et al. | 257/192 |
| 2006/0228897 A1 | * | 10/2006 | Timans | 438/758 |
| 2008/0182370 A1 | * | 7/2008 | Peidous et al. | 438/199 |

FOREIGN PATENT DOCUMENTS
WO   WO 2005/083341 A1   9/2005

* cited by examiner

*Primary Examiner*—Caridad M Everhart
(74) *Attorney, Agent, or Firm*—Williams, Morgan & Amerson, P.C.

(57) ABSTRACT

By performing sophisticated anneal techniques, such as laser anneal, flash anneal and the like, for a metal silicide formation, such as nickel silicide, the risk of nickel silicide defects in sensitive device regions, such as SRAM pass gates, may be significantly reduced. Also, the activation of dopants may be performed in a highly localized manner, so that undue damage of gate insulation layers may be avoided when activating and re-crystallizing drain and source regions.

17 Claims, 10 Drawing Sheets

TECHNIQUE FOR LOCALLY ADAPTING TRANSISTOR CHARACTERISTICS BY USING ADVANCED LASER/FLASH ANNEAL TECHNIQUES

BACKGROUND OF THE INVENTION

1. Field of the Invention

The present disclosure generally relates to the fabrication of integrated circuits, and, more particularly, to the fabrication of highly sophisticated field effect transistors, such as MOS transistor structures, requiring highly doped shallow junctions in combination with a low series resistance.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits are, and will be, based on silicon devices, due to the high availability of silicon substrates and due to the well-established process technology that has been developed over the past decades. A key issue in developing integrated circuits of increased packing density and enhanced performance is the scaling of transistor elements, such as MOS transistor elements, to provide the great number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, i.e., source and drain regions, which nevertheless exhibit a high conductivity so as to minimize the resistivity in conducting charge carriers from the channel to a respective contact area of the drain and source regions. The requirement for shallow junctions having a high conductivity is commonly met by perform-ing an ion implantation sequence to obtain a high dopant concentration having a profile that varies laterally and in depth. The introduction of a high dose of dopants into a crystalline substrate area, however, generates heavy damage in the crystal structure and, therefore, one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a loss of dopant atoms in the extension regions, thereby "blurring" the dopant profile.

Thus, on the one hand, a high anneal temperature may be desirable in view of a high degree of dopant activation and re-crystallization of implantation-induced lattice damage, while, on the other hand, the duration of the anneal process should be short in order to restrict the degree of dopant diffusion, which may reduce the dopant gradient at the respective PN junctions and also reduce the overall conductivity due to reducing the averaged dopant concentration. Furthermore, very high temperatures during the anneal process may negatively affect the gate insulation layer, thereby reducing the reliability thereof. That is, high anneal temperatures may degrade the gate insulation layer and thus may influence the dielectric characteristics thereof, which may result in increased leakage currents, reduced breakdown voltage and the like. Therefore, for highly advanced transistors, the positioning, shaping and maintaining of a desired dopant profile are important properties for defining the final performance of the device.

In an attempt to reduce the overall series resistance of the current path in the transistor devices, not only the channel length is reduced but also the resistance of portions of the drain and source regions is lowered by the incorporation of metal silicide, which typically exhibits a lower sheet resistance compared to silicon, even if highly doped. For example, nickel is a refractory metal that is frequently used in advanced transistors for locally increasing the conductivity of doped silicon areas due to the moderately low resistance of nickel silicide compared to other metal silicides. For example, nickel silicide regions may be formed in restricted surface areas of the drain and source regions and in the gate electrode to provide increased conductivity in these areas. Unfortunately, the desired high conductivity of nickel silicide is typically accompanied with severe process non-uniformities occurring during the formation of respective nickel silicide regions, wherein a highly non-uniform interface is created between the doped semiconductor regions and the nickel silicide. Even so-called nickel pipes, i.e., silicide protrusions of significant length, may be created during the silicidation process. These silicide protrusions may extend into the channel region of the transistor and may therefore significantly affect the overall behavior of the transistor, which may even include a short of the PN junction, thereby causing a transistor failure. The non-uniformity of the nickel silicide process may, among others, depend on the diffusion conditions in the respective doped silicon areas, and, thus, the doped concentration, the crystallinity of silicon and the temperature may represent important factors for the result of the silicidation process. Thus, the degree of silicide failures due to nickel silicide tunnels in respective channel regions may depend on the complex history of the device and the respective silicidation parameters, wherein the silicidation defects may affect certain device areas more strongly compared to other device areas.

As is evident from the above-described situation during manufacturing sophisticated transistor devices, a plurality of complex interdependencies exist between many mechanisms for increasing the overall drive current capability of transistors, wherein the situation may even further increase in complexity when additional strategies for enhancing transistor performance are incorporated into the manufacturing sequence. For example, a certain type of strain may be intentionally created in the respective channel regions in order to increase the respective charge carrier mobility, which directly translates into a reduction of the channel resistance. In some approaches, stressed layers are provided in the vicinity of the channel regions to transfer stress forces into the channel region. In other strategies, strained semiconductor material may be used as strain-inducing sources. Also, in these cases, the provision of strained semiconductor materials, stressed overlayers and the like may have a significant influence on the previously described processes with respect to increasing the drive current capability by providing well-defined dopant profiles and highly conductive metal silicide regions, since, for instance, the diffusion behavior of a refractory metal may depend on the presence of non-silicon species, such as germanium, carbon and the like.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for enhancing the transistor performance in a highly localized fashion by performing anneal processes in a localized manner. It has been recognized that a plurality of manufacturing processes are strongly affected by respective heat treatments, wherein a tailored local variation of the respective process parameters may be advantageously used in generating appropriately varying transistor characteristics. In this manner, well-established process conditions for a certain process sequence may be maintained, wherein local variation of the anneal process may then be used for locally enhancing or decreasing the effects of the respective anneal process. As previously explained, metal silicide process regimes, as well as the dopant activation, which includes the re-crystallization of implantation-induced damage, may significantly depend on the process parameters of a respective heat treatment, such as the temperature and the duration thereof, wherein, in some cases, controversial requirements are imposed by the respective process sequences, which may, in conventional process strategies, substantially prevent an optimized process result in a locally resolved manner. Thus, in some embodiments, sophisticated laser-based or flash-based anneal techniques may be used in order to locally control the respective anneal processes.

According to one illustrative embodiment disclosed herein, a method comprises forming a first metal silicide in a first device region of a semiconductor device on the basis of a first reaction temperature created by irradiating the first device region by radiation of a specified wavelength range. Furthermore, the method comprises forming a second metal silicide in a second device region of the semiconductor device on the basis of a second reaction temperature created by irradiating the second device region by radiation of the specified wavelength range, wherein the first temperature is less than the second temperature.

According to another illustrative embodiment disclosed herein, a method comprises selectively modifying surface characteristics of a first device region and a second device region of a semiconductor device to provide different optical responses in the first device region and the second device region to a specified wavelength range of radiation. The method further comprises irradiating the first and second device regions with a beam of the radiation to initiate a dopant activation process in the first and second device regions, wherein each surface portion irradiated by the beam is irradiated for a time interval of approximately one microsecond or less.

According to yet another illustrative embodiment disclosed herein, a method comprises preparing a first device region and a second device region of a semiconductor device so as to provide different optical responses in the first device region and the second device region to radiation of a specified wavelength range. The method further comprises annealing the first and second device regions by at least one of a laser anneal process and a flash anneal process using a beam of the radiation of specified wavelength to initiate at least one of a silicidation process and a dopant activation process in the first and second device regions.

BRIEF DESCRIPTION OF THE DRAWINGS

The disclosure may be understood by reference to the following description taken in conjunction with the accompanying drawings, in which like reference numerals identify like elements, and in which.

Figure 1A:
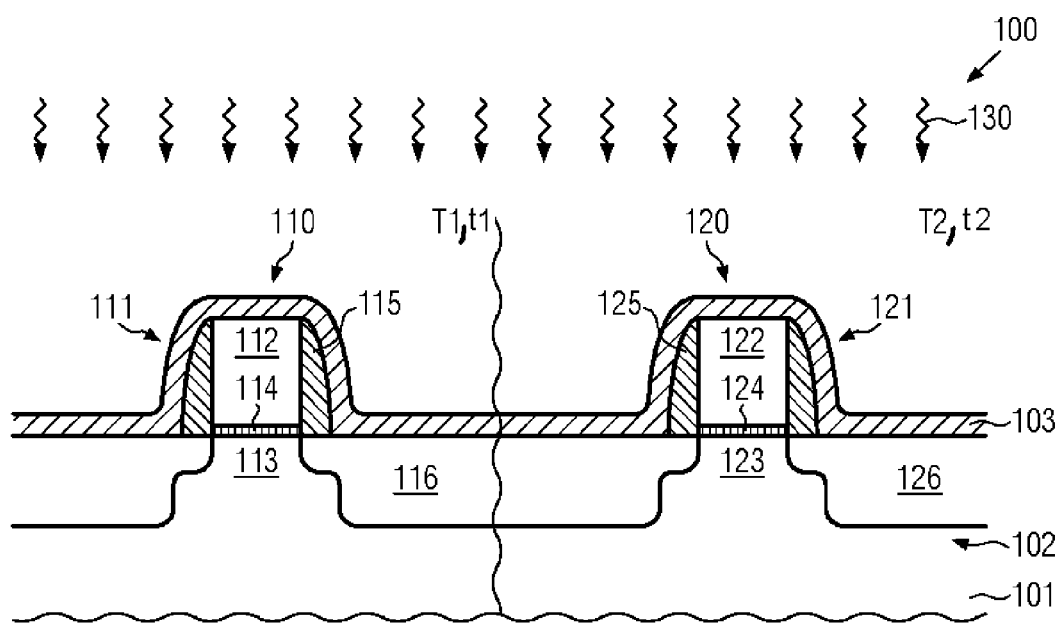
FIG. 1a schematically illustrates a cross-sectional view of a semiconductor device including two device regions during a process sequence for forming respective metal silicide portions on the basis of a laser-based or flash-based anneal process with different process parameters in the first and second device regions according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to the local variation of process parameters of an anneal process, or to the local variation of a respective anneal effect obtained by predetermined process parameters of a respective anneal sequence. In conventional strategies, it is typically attempted to increase the process uniformity of typical anneal processes, such as sophisticated laser-based and flash-based anneal processes, in order to provide uniform process results across the entire substrate. Contrary to the conventional approach, the subject matter disclosed herein takes into consideration that a plurality of process results may significantly depend on the local process conditions during an anneal process, wherein, in particular, metal silicide formation processes and dopant activation processes may have a significant influence on the overall performance of transistors, as is described above. Due to recent developments in sophisticated anneal techniques, it has been recognized that in many cases the heating of a near-surface area of a corresponding semiconductor device may be advantageous in obtaining the desired process results, contrary to other strategies in which it has been attempted to heat substantially the entire substrate to a uniform temperature in order to obtain uniform process results. Thus, in sophisticated anneal techniques, respective surface portions are exposed to an appropriately selected radiation for moderately short time periods, in which near-surface areas may be sufficiently heated for initiating the desired reaction in the heated device portions, while deeper lying sub-surface substrate areas are not substantially affected during the time interval of the exposure, since the available time is not sufficient for obtaining a thermal equilibrium by energy transportation within the substrate. Similarly, an energy deposition in one near-surface device area may not substantially affect the condition of an adjacent device area having received a different amount of energy deposition. Consequently, sophisticated anneal techniques may provide the potential for laterally "patterning" the anneal parameters and/or at least the effect of the anneal process, when performed on the basis of identical process parameters in adjacent device areas.

As previously explained, the formation of metal silicide, and in particular the formation of the highly conductive nickel silicide, may be affected by the respective process temperatures used during the silicidation process. In particular, the creation of respective nickel silicide defects, such as nickel silicide pipes or tunnels, may depend on the effective temperature, wherein an increasing process temperature may result in an increased probability for the formation of respective nickel silicide pipes or tunnels. Consequently, an appropriately designed anneal process may be performed differently in different device regions so as to reduce the tendency for metal silicide defects in critical device areas, while substantially maintaining the remaining process parameters constant for the different device regions, thereby providing a high degree of compatibility with conventional process strategies.

In other aspects, additionally or alternatively to modifying a respective metal silicide process sequence, the anneal processes may be performed on the basis of appropriately modified device surfaces so as to obtain different optical responses with respect to an incident radiation beam, wherein the local variation may be obtained in a highly locally resolved manner in order to, in one example, even provide a different temperature profile within different device regions of a single transistor element. In this way, the temperature profile within a transistor element may be appropriately patterned in order to take into consideration the different requirements for dopant activation in the drain and source regions relative to the thermal stability of sensitive device areas, such as the gate insulation layer, of advanced transistor elements.

It should be appreciated that the subject matter disclosed herein is highly advantageous in the context of sophisticated transistor elements and semiconductor devices, wherein respective critical dimensions, such as the gate length, may be approximately 100 nm and significantly less, since here even subtle mutual interdependencies of various processes may significantly affect the overall performance of the transistor elements. However, the principles of the present invention may also be advantageously applied to any semiconductor device, even for less critical applications, thereby improving yield, performance and reliability of these devices substantially without contributing to process complexity. Thus, the present invention should not be construed as being restricted to specific device dimensions and transistor architectures, unless such restrictions are explicitly set forth in the description or the appended claims.

FIG. 1a schematically illustrates a semiconductor device 100 which may comprise a first device region 110 and a second device region 120. The device 100 may further comprise a substrate 101, which may represent any appropriate carrier material having formed thereon an appropriate semiconductor layer 102, which may be comprised of any appropriate silicon-based material. In this case, a silicon-based material is to be understood as a semiconductor material having at least a sufficient amount of silicon atoms in order to allow the formation of metal silicide in specified regions of the semiconductor layer 102. Furthermore, the substrate 101, in combination with the semiconductor layer 102, may represent a silicon-on-insulator (SOI) configuration, wherein a buried insulating layer (not shown) may be formed between the carrier material of the substrate 101 and the semiconductor layer 102. Moreover, the first and second device regions 110, 120 may be separated by respective isolation structures (not shown), such as shallow trench isolations and the like, while, in other embodiments, the regions 110, 120 may not necessarily be bordered by respective isolation structures but may be defined on the basis of any circuit elements contained therein. That is, the device region 110 may have formed therein one or more circuit elements 111, which, in the present case, are illustrated as a transistor element which may require a different temperature and/or duration during an anneal process compared to a circuit element 121 formed in the second device region 120 due to a different sensitivity to metal silicide defects during a subsequent metal silicide formation process. Thus, in the manufacturing stage shown in FIG. 1a, the circuit element 111 may comprise a respective gate electrode 112 that is separated from a respective channel region 113 by a gate insulation layer 114. Furthermore, a sidewall spacer structure 115 may be formed on sidewalls of the gate electrode 112, and drain and source regions 116 may be positioned in the semiconductor layer 102 so as to laterally enclose the channel region 113. Similarly, respective components may be provided for the circuit element 121 in the second device region 120. That is, the circuit element 121 may comprise a gate electrode 122, a gate insulation layer 124, a channel region 123, drain and source regions 126 and a sidewall spacer structure 125. For example, the circuit elements 111, 121 may represent transistor elements of different conductivity type or may represent transistor elements formed in different device regions having a different probability for forming respective metal silicide defects during a corresponding manufacturing sequence. Furthermore, a layer of refractory metal 103 may be formed above the first and second device regions 110, 120, wherein, in some illustrative embodiments, the metal layer 103 may comprise nickel, possibly in combination with other refractory metals, such as platinum and the like.

A typical process flow for forming the semiconductor device as shown in FIG. 1a may comprise the following processes. After providing the substrate 101 having formed thereon the semiconductor layer 102, respective active regions may be defined by forming appropriate isolation structures (not shown) on the basis of well-established techniques. Thereafter, the gate electrodes 112, 122 and the gate insulation layers 114, 124 may be formed on the basis of sophisticated oxidation and/deposition techniques in combination with highly sophisticated lithography processes and etch techniques, wherein the gate electrodes 112, 122 may be formed of polysilicon material, which may also receive a metal silicide in a later manufacturing stage.

Next, portions of the drain and source regions 116, 126 may be formed on the basis of ion implantation, and an appropriate spacer structure, such as the spacer structures 115, 125, may be subsequently formed for appropriately creating the desired vertical and lateral dopant profile for the drain and source regions 116. It should be appreciated that corresponding implantation sequences may be performed in any appropriate manner in order to provide the highly complex dopant profile in the respective device regions 110, 120. Furthermore, in some illustrative embodiments, further process steps may be performed for enhancing the transistor performance, such as providing a strained semiconductor material in the drain and source regions 116 and/or the channel regions 113, 123, depending on the process strategies. After the above-described process sequence, the spacer structures 115, 125, if not yet provided for profiling the drain and source regions 116, 126, may be formed on the basis of well-established techniques.

Thereafter, the metal layer 103 may be deposited on the basis of well-established deposition techniques such as sputter deposition, chemical vapor deposition (CVD) and the like. Thereafter, an anneal process 130 may be performed in some illustrative embodiments on the basis of different process parameters, such as temperature and duration, for the first and second device regions 110, 120, as indicated by T1, t1 and T2, t2. In other illustrative embodiments, the actual process parameters of the anneal process 130 may be substantially identical in the first and second device regions 110, 120 wherein the corresponding response to the anneal process may be modified differently for the device regions 110, 120 so as to obtain at least a different temperature in the first and second device regions 110, 120. The anneal process 130 may be based on a beam of radiation of a specified wavelength range, which may be created by any appropriate sophisticated anneal system, a representative example of which may be described with reference to FIG. 1b.

Thus, due to the different process parameters, such as the anneal temperature experienced by the refractory metal layer 103 in the first device region 110, the corresponding reaction behavior, for instance the diffusion characteristics of the metal atoms and the silicon atoms, may be modified so as to reduce the probability of the formation of metal silicide defects, which may possibly be associated with a variation of other characteristics of the metal silicide, which may, however, not unduly negatively affect the overall performance of the circuit elements 111. Similarly, the circuit element 121 may be exposed to the target process parameters during the anneal process 130 in order to obtain the desired characteristics of the respective metal silicide created during the anneal process 130, wherein a higher probability for the formation of metal silicide defects may be less critical due to, for instance, design-specific characteristics of the circuit element 121. It should be appreciated that the process of forming a metal silicide may comprise several process steps, such as, for instance, a first anneal step during the process 130 causing a corresponding metal silicide formation and a subsequent step for obtaining a desired thermal stability of the finally obtained metal silicide. In some illustrative embodiments, an intermediate etch step may be performed so as to remove non-reacted metal in the layer 103 selectively with respect to the metal silicide created. Thus, when two or more anneal steps may be performed during the anneal process 130, at least in one anneal step the respective temperature may be selected less in the first device region 110, having the sensitive circuit element 111, in order to reduce the probability of metal silicide defects, while the remaining process sequence may be identical for the first and second device regions 110, 120, thereby providing a high degree of compatibility with conventional strategies.

In one illustrative embodiment, the layer 103 may comprise nickel, which may be converted into nickel silicide at process temperatures of approximately 200-500° C., wherein a corresponding target temperature may be selected for the non-sensitive device region 120, while a reduced temperature may be generated in the first device region 110. It should be appreciated that the corresponding wavelength range of the radiation, such as laser radiation or a flash lamp radiation, as well as the duration, may be appropriately adjusted in order to obtain the different anneal temperatures. Typically, in sophisticated anneal techniques on the basis of laser radiation and flash radiation, the exposure time of any surface portion irradiated by the impinging beam of radiation is restricted to 0.1 seconds and significantly less, such as several microseconds to nanoseconds. Consequently, since the corresponding irradiation interval may be too short for allowing adjacent regions to take on a thermal equilibrium state in the vertical direction as well as in the lateral direction during the exposure time interval, the corresponding reaction temperature may be appropriately adjusted individually for both device regions. The corresponding radiation of the process 130 may be provided by a pulsed laser source, a pulsed flash lamp or by a continuous irradiation beam, which may be scanned across the substrate 101 with an appropriate speed so as to reduce the actual exposure time of each surface portion to the desired short time interval.

Figure 1B:
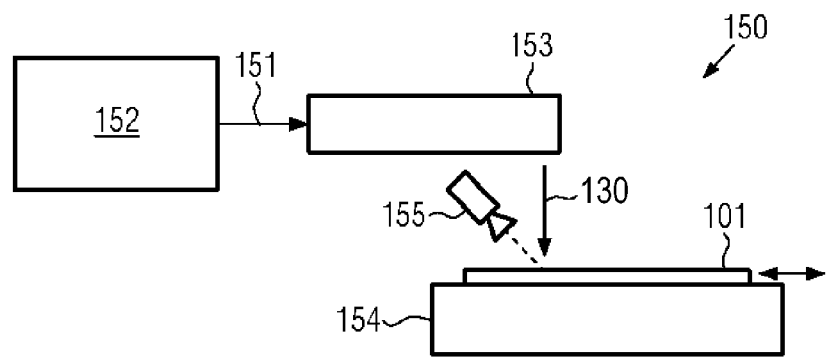
FIG. 1b schematically illustrates an anneal system used to perform a radiation-based anneal process with short exposure intervals.

FIG. 1b schematically illustrates an exemplary system 150 for performing the anneal process 130. The system 150 may comprise an appropriate radiation source 152, such as a laser source, which may provide a continuous or a pulsed laser beam 151. Moreover, an appropriate beam shaping system 153 may be provided in order to establish appropriate beam characteristics, that is, a specific beam shape and energy density, which may be accomplished on the basis of well-established techniques. Thus, radiation appropriate for the anneal process 130 may be provided at an output of the beam shaping system 153, which may further be configured to direct the resulting radiation, that is, the radiation of the process 130, onto a substrate holder 154 which may, for instance, be provided in the form of a mechanical scan system. Moreover, a measurement system 155, which may include a temperature sensor, a power detector and the like, may be provided to detect a status of a substrate positioned on the substrate holder 154, such as the substrate 101 having formed thereon the first and second device regions 110, 120.

During operation of the system 150 for performing the anneal process 130, the substrate 101 may be positioned on the respective scan system or substrate holder 154, which may appropriately adjust the relative position between the radiation of the process 130, exiting the beam shaping system 153, and the position on the substrate 101. In some illustrative embodiments, when the corresponding beam size impinging on the substrate 101 is less than the area occupied by the first device region 110, the respective anneal process parameters may be adjusted on the basis of the scan speed and/or may be controlled on the basis of control data supplied to the laser source 152. The measurement system 155 may provide respective data in order to detect and monitor the output power emitted by the beam shaping system 153 and the actually obtained temperature at the irradiated site at the substrate 101. For example, if the local resolution of the measurement system 155 is sufficient to resolve the first and second device regions 110, 120, the corresponding actual reaction temperature may be determined on the basis of measurement data obtained from the measurement system 155, which may then also be used for controlling the corresponding anneal process 130. Thereafter, the substrate may be irradiated such that the radiation of the anneal process 130 and thus the time of actively heating the exposed site of the substrate 101 is significantly less than approximately 0.1 seconds, which may be accomplished by using short radiation pulses and/or using a high scan speed, when, for instance, a continuous radiation is used. For example, anneal times, that is, actively supplying radiation energy to an irradiated site at the substrate 101, of several milliseconds and significantly less, and even several microseconds, nanoseconds and less, may be generated in order to effectively perform the anneal process 130, depending on the process requirements. As will be described later on, the corresponding characteristics of the radiation and the exposure time interval may also be appropriately selected in order to effectively activate dopants in respective semiconductor regions, wherein extremely high temperatures may be generated in a highly localized fashion.

During the anneal process 130, the radiation may be, at least partially, absorbed and may therefore result in a respective reaction energy, that is, kinetic energy, for the atoms of the refractory metal layer 103 and the silicon in order to initiate a corresponding diffusion and conversion into metal silicide, wherein the heat may then be dissipated into the "depth" of the substrate 101, substantially without significantly raising the temperature thereof. For example, the back side of the substrate 101 may remain at a temperature of approximately 50° C. and even significantly less, while, on the other hand, high temperatures may be locally generated in near-surface portions of the regions 110, 120, as required for initiating the corresponding silicidation process, wherein, however, a different reaction temperature may be generated in the first and second device regions 110, 120.

It should be appreciated that the system 150 may be considered as a representative example of a system for performing the anneal process 130 in order to obtain the desired temperature profile for the regions 110, 120 with an effective irradiation time of 0.1 seconds and significantly less. In other systems, the light source 152 may represent a pulsed flash lamp emitting a moderately broad wavelength range wherein, depending on the system configuration, the substrate 101 may be irradiated as a whole or may be irradiated partially, as is shown in FIG. 1b. When the substrate or significant portions thereof are irradiated in a common exposure step, when, for example, the first and the second device regions 110, 120 may be irradiated together, appropriate measures may be taken so as to correspondingly modify the optical response of the regions 110, 120 in order to obtain different process conditions therein.

Figure 1C:
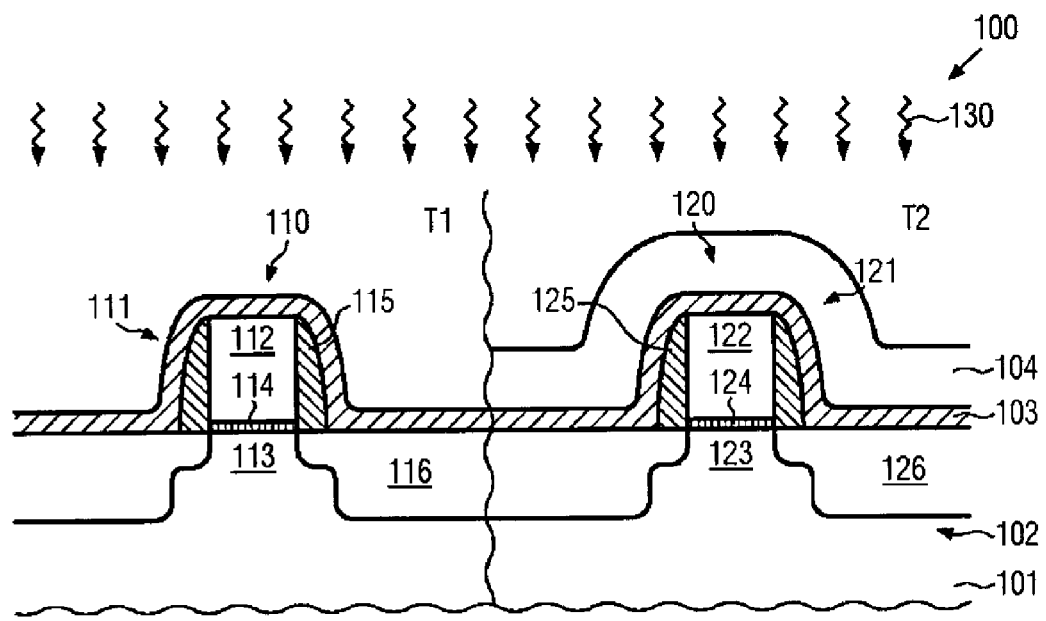
FIGS. 1c-1e schematically illustrate cross-sectional views of a semiconductor device during the formation of metal silicide regions in different device regions using various material layers for modifying the optical response to a specified wavelength range according to further illustrative embodiments.

FIG. 1c schematically illustrates the device 100 according to further illustrative embodiments, wherein, additionally or alternatively to varying the process parameters of the anneal process 130, the corresponding optical response may be adjusted to be different in the first region 110 and the second region 120. In the embodiment shown, an appropriate absorption layer 104 may be formed in the second device region 120, while the first region 110 may remain uncovered or, in other illustrative embodiments (not shown), a respective thickness may be selected differently in order to reduce the amount of absorbed energy therein. For example, the absorption layer 104 may be provided in the form of any appropriate material, such as polymer material, resist material or dielectric materials that may not significantly react with the underlying metal layer 103 at the corresponding reaction temperatures induced by the anneal process 130. For this purpose, an appropriate material layer may be formed above the first and second device region 110, 120 on the basis of any appropriate deposition technique and the corresponding material layer may be selectively removed or at least reduced in thickness in the first device region 110 on the basis of lithography and etch techniques as are readily available in the art. It should be appreciated that a thickness of the absorption layer 104 may be designed in view of the wavelength range used for performing the anneal process 130 in order to reduce the back reflection. By appropriately selecting the thickness of the layer 104, the efficiency thereof may be readily controlled so as to obtain the desired difference in the optical response and thus in the resulting reaction temperatures in the first and second device regions 110, 120. In other illustrative embodiments, alternatively or additionally to providing the absorption layer 104, a modification of the reflectivity at least in the first device region 110 may be provided, for instance, by means of providing a corresponding reflective layer, thereby reducing the amount of energy deposited in the first device region 110. In other cases, the surface configuration of the material layer 103 may be modified in order to correspondingly adapt the optical behavior of the layer 103 with respect to the incident radiation of the anneal process 130. As previously explained, in other illustrative embodiments, a difference in the reaction temperature may be achieved after a first anneal step for initiating a chemical reaction and after the removal of any non-reacted metal of the layer 103, wherein a corresponding reflectivity layer or absorption layer, such as the layer 104, may be formed directly on the respective circuit element 111 and/or 121.

Figure 1D:
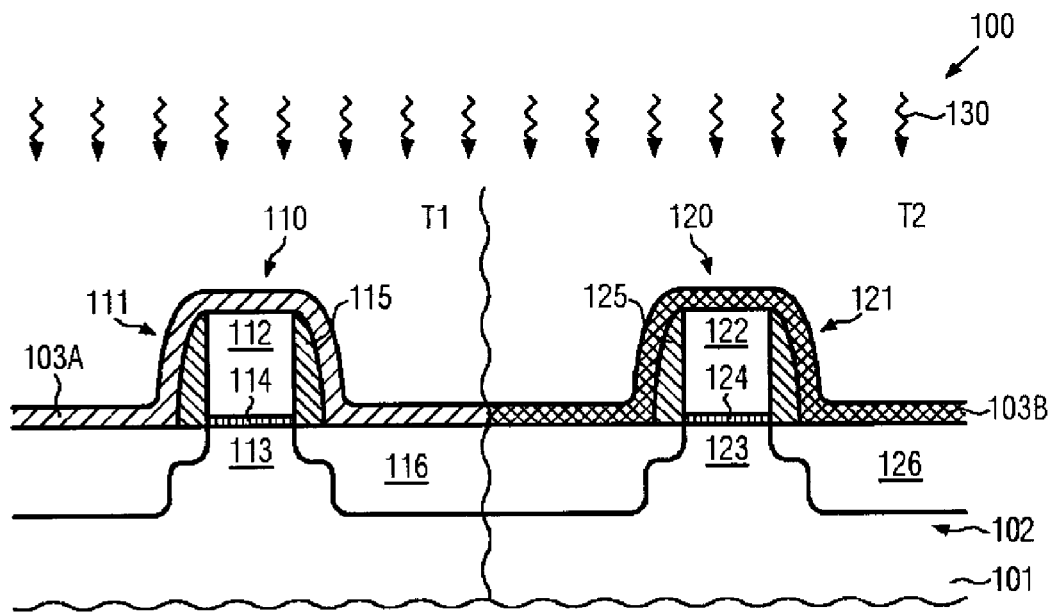

FIG. 1*d* schematically illustrates the semiconductor device 100 according to a further illustrative embodiment in which a different optical response may be obtained by providing, additionally or alternatively to any further measures for modifying the optical behavior in the first and second device regions 110, 120, a different type of refractory metal wherein different reaction temperatures may be advantageous for obtaining the desired type of metal silicide in the respective regions 110, 120. For example, respective metal layers 103A, 103B may be formed above the first and second device regions 110, 120 in order to selectively reduce the risk for metal silicide defects, wherein different process temperatures may be required. If, for instance, nickel and cobalt may be provided as the layers 103A, 103B, a reduced temperature may be required in the first region 110, while, in general, a higher process temperature as well as possibly a different process sequence may be necessary in the second device region 120. Thus, when the corresponding radiation of the anneal process 130 may per se be provided with a high local resolution, for instance when the corresponding radiation beam, as may be provided by the system 150, may have a size less than the size of the respective regions 110, 120, the corresponding process parameters may be individually adapted by appropriately controlling the scan process and/or the operation of the respective radiation source, as is previously described. In other cases, the difference in optical characteristics of the layers 103A, 103B may per se provide a different optical response, even if the same irradiation parameters may be used. If the corresponding difference may not be appropriate or may not be sufficient in order to provide the desired difference in reaction temperature, appropriate measures, such as additional absorption and/or reflective layers, surface modifications and the like, may be used to adjust the corresponding energy deposition during the anneal process 130. Moreover, if different process steps for the different metals of the layers 103A, 103B may be advantageous, a corresponding different process sequence may be established even if the corresponding beam of radiation may not have a local resolution that allows individual exposure of the first and second device regions 110, 120. For example, when the first and second regions 110, 120 are irradiated by the same irradiation parameters, appropriate process conditions may be individually adjusted on the basis of appropriately designed cover layers, which may be provided in the form of reflective layers and/or absorbing layers, so that the effect of one anneal step may have substantially none or a significantly reduced effect in respective device regions in which the corresponding anneal step may not be advantageous. Thus, in addition to providing different reaction conditions in the first and second device regions 110, 120, even different metal silicides may be formed, while nevertheless maintaining a high degree of compatibility with the conventional process flow.

Figure 1E:
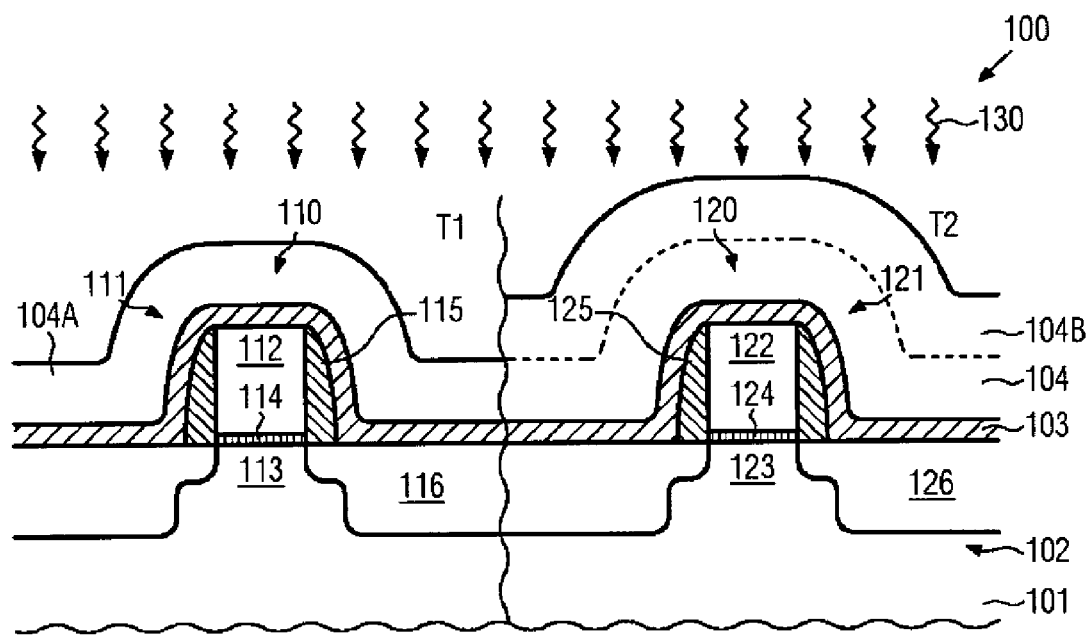

FIG. 1*e* schematically illustrates the semiconductor device 100 in accordance with one illustrative embodiment in which the optical response of the device regions 110, 120 is modified by providing different types of cover layers 104A, 104B wherein the corresponding thicknesses and/or material compositions may be adjusted so as to obtain the desired optical behavior in response to at least one annealing step of the process 130. For instance, a base layer 104 may be provided above the first and second device regions 110, 120 in order to adjust the general behavior with respect to the incident radiation, i.e., if the reflectivity of the metal layer 103 may result in an undesired low energy deposition, the base layer 104 may provide general increased energy absorption in both the region 110 and 120. Thereafter, a further material layer may be deposited, which may be comprised of the same material or a different material, which may then be selectively moved above one of the regions 110, 120 to obtain the difference in optical response. In the embodiment shown, an additional layer may be formed above the second device region 120 so as to define the layer portion 104B, which may result in a higher absorption capability, thereby creating a high temperature in the region 120. In other cases, the absorbing capability of the base layer 104 may be reduced in the first device region 110, for instance by providing a corresponding layer increasing the amount of reflectivity. The corresponding layer may be formed on the basis of well-established lithography and etch techniques.

Figure 1F:
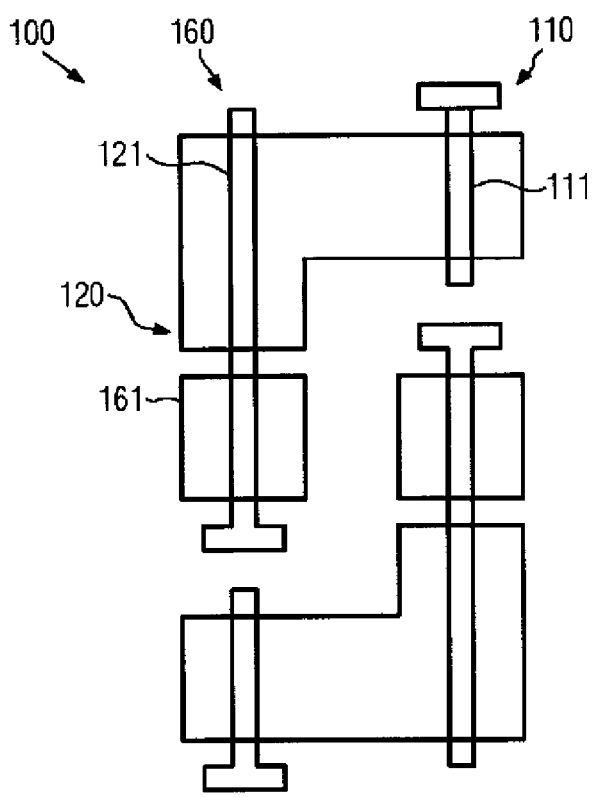
FIG. 1f schematically illustrates a top view of a typical SRAM cell, in which portions may be heat treated on the basis of different process parameters during the formation of metal silicide in accordance with other illustrative embodiments.

FIG. 1*f* schematically illustrates the semiconductor device 100 in a top view according to further illustrative embodiments. Here, the first and second device regions 110, 120 may represent a portion of a static RAM cell 160 which may comprise an N-channel transistor, such as the transistor 121 as previously described in the first device region 120, which may form a complementary transistor pair with a corresponding P-channel transistor 161. The output of the inverter pair defined by the transistors 121 and 161 may be connected to a further N-channel transistor representing the first device region 110, which may therefore be represented by the transistor 111 as previously described. The transistor 111 may be considered as a pass gate for a signal provided by the transistor 121. It has been recognized that the pass gate 111 may represent a critical device region with respect to metal silicide defects, especially for nickel silicide defects, as previously explained. Consequently, the corresponding anneal temperature may be locally reduced in the first device region 110 on the basis of the anneal process 130, as previously described, so as to reduce the probability for creating nickel silicide pipes or tunnels in the pass gate 111 with only minor influences on the overall silicidation process. Hence, respective process parameters that may be appropriate for the device region 120 may be maintained, while nevertheless increased device reliability and production yield may be obtained due to reduced SRAM failures. It should be appreciated that any of the above-described process sequences and combinations thereof may be used so as to appropriately "pattern" the corresponding metal silicide processing in order to reduce the silicide defects in the first region 110. For example, a different type of metal silicide may be provided in the transistor 111, if the corresponding resulting series resistance obtained therein is compatible with the overall design criteria.

With reference to FIGS. 2a-2m, further illustrative embodiments will now be described, in which a sophisticated anneal process is applied to the activation of dopants in a semiconductor region, possibly in combination with an advanced silicidation process, wherein different process temperatures are created in a highly local manner, such that a temperature difference may even be created within a single transistor element. As previously explained, in sophisticated applications, extremely shallow dopant profiles may be required at a high dopant concentration so that the corresponding thermal budget may be extremely restricted in these applications. Hence, advanced annealing techniques, as previously described with reference to FIG. 1b, may be highly advantageous since extremely high temperatures may be created, even up to 1300° C. and even higher, in a highly locally restricted manner and in extremely short time intervals so that an efficient dopant activation and re-crystallization mechanism may be established, while the diffusion activity of the dopants is extremely low.

Figure 2A:
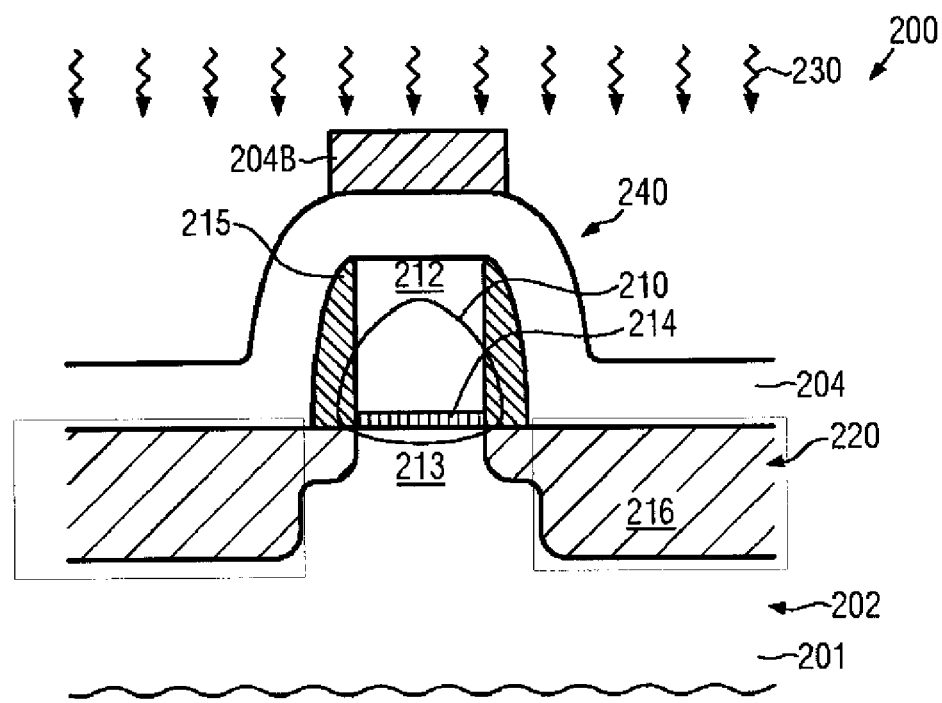
FIG. 2a schematically illustrates a cross-sectional view of a transistor element representing two different device regions, which may receive a different amount of energy deposited therein during an anneal process for activating dopants in drain and source regions according to further illustrative embodiments.

FIG. 2a schematically illustrates a semiconductor device 200 comprising a substrate 201 having formed thereon a semiconductor layer 202. With respect to the substrate 201 and the semiconductor layer 202 the same criteria apply as previously explained with reference to the device 100. The semiconductor device 200 may comprise a circuit element, such as a field effect transistor 240, which may comprise a first device region 210 and a second device region 220. Thus, the first and second device regions 210, 220 may represent specific portions of the transistor element 240. In the manufacturing stage illustrated in FIG. 2a, the transistor 240 may comprise a gate electrode 212 formed on a gate insulation layer 214, which separates the gate electrode 212 from a corresponding channel region 213 that is defined in the semiconductor layer 202 by respective drain and source regions 216. Furthermore, a corresponding sidewall spacer structure 215 may be formed on sidewalls of the gate electrode 212. The drain and source regions 216 may have incorporated therein respective dopants with an appropriate dopant profile and concentration as is required by design rules. It should be appreciated that typically the semiconductor layer 202 may represent a silicon-based layer, i.e., a semiconductor layer comprising a significant amount of silicon atoms, wherein additional components, such as germanium, carbon and the like, in addition to the dopant species, may be included in order to adjust the characteristics of the transistor 240. It should be appreciated, however, that the highly local adjusting of the corresponding activation temperature may also be applied to any type of circuit element, irrespective of the configuration thereof and the material composition used for forming the same.

Depending on the process specifics, the drain and source regions 216 may comprise a more or less pronounced amount of crystalline defects or may even be provided in a substantially amorphous state due to any preceding implantation processes, which may have to be re-crystallized, thereby also activating corresponding dopant species defining the drain and source regions 216. Furthermore, the semiconductor device 200 may comprise, in this manufacturing stage, a corresponding absorption layer 204, which may be comprised of any appropriate material, such as silicon dioxide, silicon nitride, amorphous carbon or any combinations thereof, or any other appropriate material that may be capable of absorbing radiation energy and withstand the corresponding high temperatures obtained during a subsequent anneal process. Furthermore, a cover layer 204B may be provided so as to locally adapt the optical response in the device 200 with respect to an incident beam of radiation of an anneal process 230. The cover layer 204B may be formed of any appropriate material in order to obtain a certain degree of "shadowing" of the first device region 210, which may include a portion of the gate electrode 212 and the gate insulation layer 214. For example, the cover layer 204B may provide increased reflectivity so as to reduce to a certain degree the amount of radiation absorbed by the absorption layer 204 and possibly by any underlying device regions in the vicinity of the first device region 210. For example, the material composition of the cover layer 204B may be selected such that, in combination with the absorption layer 204, an efficient reflective layer stack may be obtained with respect to the specified wavelength or wavelength range during the anneal process 230.

A typical process flow for forming the semiconductor device 200 as shown in FIG. 2a may comprise the following processes. The transistor 240 may be formed on the basis of well-established techniques, which may comprise similar processes as are previously described with reference to the device 100. That is, after forming the drain and source regions 216 on the basis of respective implantation sequences or any other techniques which may require a subsequent activation of the respective dopant species, the absorption layer 204 may be formed on the basis of any appropriate deposition technique, such as CVD, in order to increase the overall absorption capability of the device 200 with respect to the radiation used during the anneal process 230. Thereafter, the cover layer 204B may be formed, for instance on the basis of established lithography techniques, wherein, in some embodiments, respective planarization layers may be used in order to obtain a substantially planar surface configuration prior to performing a respective lithography process. In other illustrative embodiments, as will be described later on in more detail, a respective cover layer or any other appropriate patterning of the optical behavior of the transistor 240 may be obtained on the basis of "self-aligned" techniques.

After forming the cover layer 204B or otherwise patterning the optical behavior of the transistor 240 so as to reduce the energy absorption capability within the first device region 210, the anneal process 230 may be performed on the basis of appropriately selected process parameters. That is, an appropriate wavelength range or wavelength may be selected in combination with a required energy density and duration of the exposure of respective surface portions in order to obtain a high temperature, which may be up to 1300° C. and even higher, wherein the corresponding wavelength of the radiation during the anneal process 230 is selected such that a corresponding energy absorption is substantially restricted to surface portions including the semiconductor layer 202, while deeper lying substrate areas are substantially not affected by the corresponding radiation. For this purpose, the corresponding energy density of a corresponding radiation beam, such as a laser beam, a flash lamp beam and the like, may be adjusted so as to obtain the desired energy deposition for creating the high temperature within an extremely short time period, for instance in the range of microseconds and even significantly less, so as to allow an efficient activation of dopant species and re-crystallization of lattice damage while nevertheless significantly restricting any dopant diffusion activity. Thus, extremely high temperatures are desirable in the drain and source regions 216 so as to efficiently activate the dopants, while a corresponding high temperature may, however, significantly degrade the characteristics of the gate insulation layer 214, thereby reducing the reliability thereof. Hence, by correspondingly patterning the optical response of the device 200 with respect to the radiation of the anneal process 230 so as to reduce the energy deposition within the region 210 or at least in the vicinity thereof, a reduced anneal temperature may be created in the vicinity of the gate insulation layer 214, thereby reducing the probability of creating corresponding defects. For example, by providing the cover layer 204B having a high degree of reflectivity, the amount of energy deposited in the first device region 210 may be reduced, even if the wavelength of the corresponding radiation during the anneal process 230 may be significantly greater compared to the lateral dimension of the gate electrode 212. Thus, although significant diffraction may occur during the irradiation of the device 200, nevertheless a reduced integral of energy deposition may be achieved in the vicinity of the gate insulation layer 214. In other illustrative embodiments, the degree of diffraction effects may be reduced by selecting a short wavelength for the corresponding irradiation of the anneal process 230, thereby even further enhancing the shadowing effect of the cover layer 204B. Consequently, an efficient dopant activation including a respective re-crystallization may be achieved, while severe damage at the gate insulation layer 214 may be significantly reduced. With respect to the specifics of the anneal process 230, it may be referred to the system 150 (FIG. 1b) and the anneal process 130, wherein, however, as previously explained, the corresponding wavelength, energy density and duration may be specifically adapted to obtain the high temperatures within the drain and source regions 216 at extremely short time intervals.

Figure 2B:
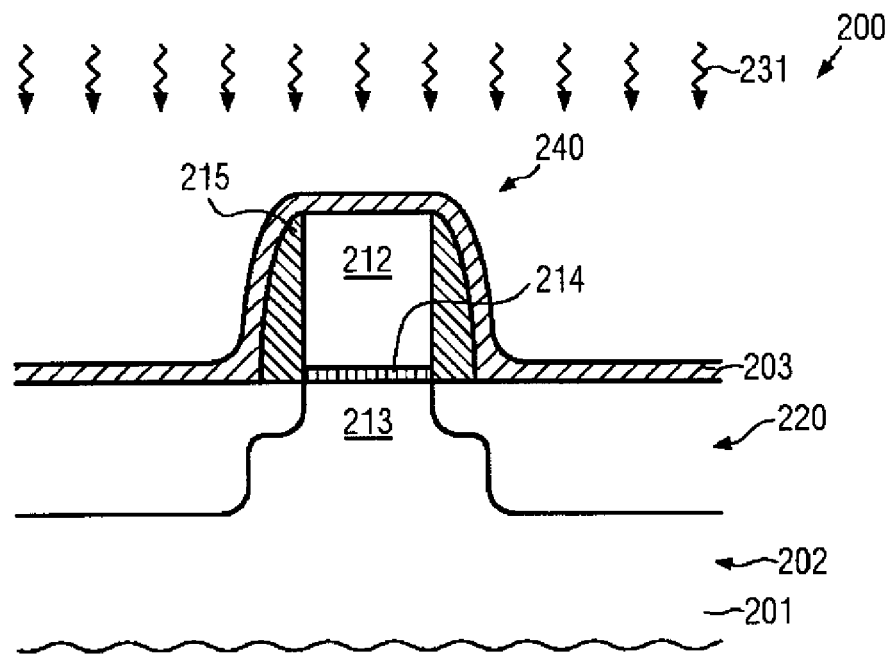
FIG. 2b schematically illustrates the semiconductor device of FIG. 2a in a further advanced manufacturing stage for receiving a metal silicide.

FIG. 2b schematically illustrates the semiconductor device 200 in a further advanced manufacturing stage. Here, the cover layer 204B and the absorption layer 204 may have been removed on the basis of any well-established etch technique and a corresponding metal layer 203 comprised of any appropriate refractory metal, such as nickel, cobalt, tungsten, nickel platinum and the like, may be formed above the transistor 240. Thereafter, a corresponding anneal process 231 may be performed on the basis of appropriate process parameters, wherein, in some illustrative embodiments, sophisticated anneal techniques, such as the process 130 previously described, may be used if different anneal temperatures may be required for different transistor devices in the semiconductor device 200, similarly as is described with reference to the semiconductor device 100. Thereafter, the further processing may be continued by embedding the transistor 240 with an appropriate interlayer dielectric material and forming respective contacts to the metal silicide regions formed on the basis of the anneal process 231.

Figure 2C:
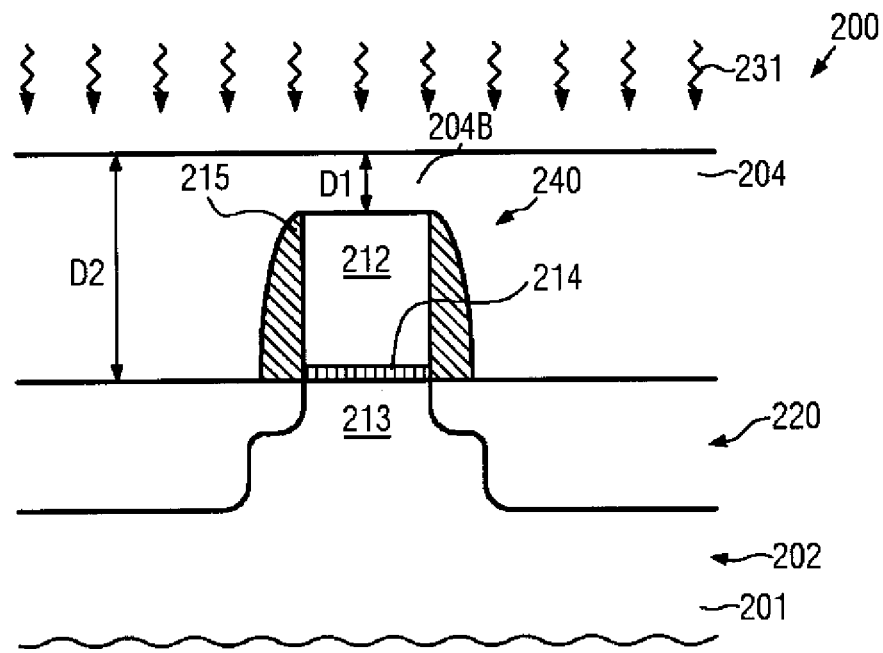
FIG. 2c schematically illustrates a cross-sectional view during the patterning of different device regions in a transistor element according to a further illustrative embodiment.

FIG. 2c schematically illustrates the semiconductor device 200 in accordance with further illustrative embodiments. In this embodiment, the absorption layer 204 may be provided with a different thickness above the first and second device regions 210, 220, that is, above the drain and source regions 216 and the gate electrode 212. For example, any appropriate material as previously specified may be deposited with an appropriate thickness wherein a subsequent planarization process, such as a chemical mechanical polishing (CMP) process and the like, may be performed in order to adjust a thickness D2 of the layer 204 above the drain and source regions 216 so as to provide a high degree of energy absorption, while a corresponding thickness D1 of a layer portion 204B above the gate electrode 212 may be reduced in order to reduce the amount of energy deposited therein. In some illustrative embodiments, the thickness D1 may be selected such that, in combination with the material of the gate electrode 212, an increased reflectivity is generated for the specified wavelength range, thereby reducing the amount of energy deposited within the gate electrode 212. In other illustrative embodiments, at least a top surface of the gate electrode 212 may be substantially completely exposed and the absorption layer 204 may be provided with an appropriate thickness and material composition above the drain and source regions 216 so as to provide increased absorption compared to the polycrystalline silicon material of the gate electrode 212. Consequently, an increased amount of energy may penetrate into deeper substrate areas in the vicinity of the gate electrode 212 due to the reduced absorption capabilities compared to the absorption layer 204 provided above the drain and source regions 216. If, for example, a corresponding thickness of the absorption layer 204 has to be significantly less compared to the height dimension of the gate electrode 212, a corresponding selective etch process may be performed on the basis of the configuration as shown in FIG. 2c so as to reduce the thickness of the absorption layer 204 to a desired value while additionally exposing the top surface of the gate electrode 212. In still other illustrative embodiments, based on the configuration of FIG. 2c, an additional layer may be formed on top of the absorption layer 204 providing enhanced reflectivity above the gate electrode 214, wherein corresponding lithography techniques may be used in order to pattern the respective reflective layer portion. It may further be appreciated that providing the absorption layer 204 so as to embed at least a portion of the gate electrode 212 may significantly reduce diffraction effects, thereby providing enhanced flexibility in selecting appropriate exposure wavelengths during the anneal process 230.

Figure 2D:
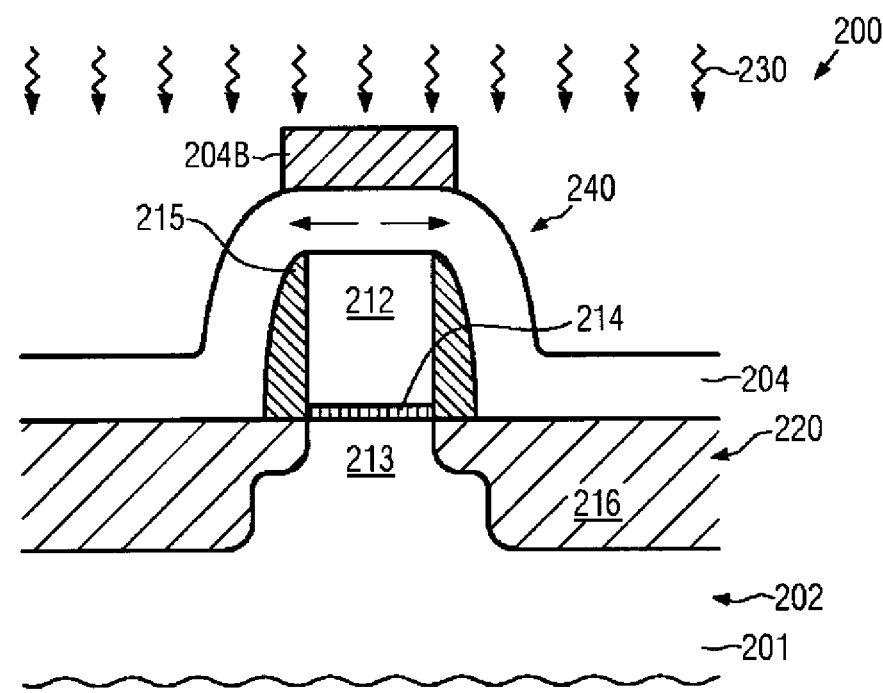
FIGS. 2d-2e schematically illustrate cross-sectional views to illustrate the local variation of process parameters in a transistor device during an anneal process for activating dopants and re-crystallizing semiconductor regions in a strained state according to further illustrative embodiments.

FIG. 2d schematically illustrates the semiconductor device 200 in accordance with further illustrative embodiments. In this case, the absorption layer 204 may be provided so as to obtain the desired local variation in optical characteristics, as previously described, for instance by providing an additional reflective portion 204B, wherein additionally the absorption layer 204 may be provided with a high intrinsic stress in order to induce a respective strain in the drain and source regions 216 upon activating and re-crystallizing these areas during the anneal process 230. For example, silicon nitride may be efficiently formed on the basis of plasma enhanced physical vapor deposition (PECVD) techniques, wherein respective process parameters, such as deposition pressure, flow rate of precursor gases, temperature, and in particular the ion bombardment during the deposition, may be appropriately adjusted in order to obtain a high tensile stress up to 1 GPa or even higher or to obtain high compressive stress up to 2 GPa or even higher. Thereafter, the anneal process 230 may be performed on the basis of appropriately selected process parameters, as previously described, wherein the re-crystallization process may proceed in the presence of a high stress component, thereby resulting in a corresponding strained lattice structure of drain and source regions 216. Consequently, a significant amount of strain may also be induced in the channel region 213, wherein a certain degree of strain may still be maintained, even if the absorption layer 204 has to be removed in a later manufacturing stage. The further processing may then be performed by forming a respective metal silicide region after the removal of the absorption layer 204 and the cover layer 204B, as is previously described with reference to FIG. 2b.

Figure 2E:
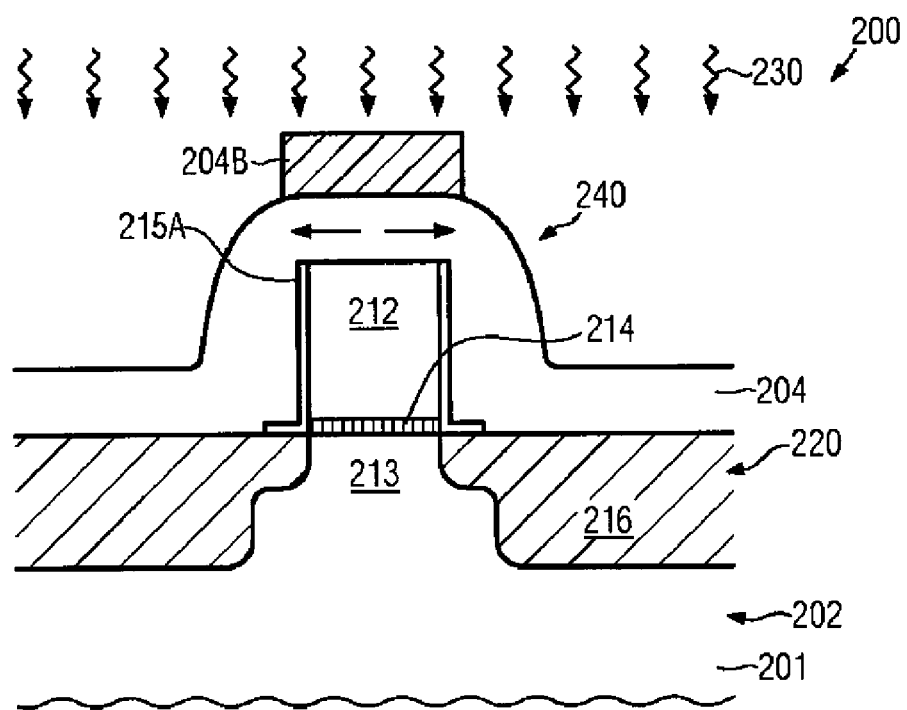

FIG. 2e schematically illustrates the semiconductor device 200 wherein, prior to forming the stressed absorption layer 204, the corresponding sidewall spacer structure 215 may be removed, for instance on the basis of highly selective etch processes. To this end, a corresponding liner 215A may have been formed during respective process sequences for forming the spacer structure 215. Consequently, the stressed material of the layer 204 may be positioned more closely to the gate electrode 212 and thus more closely to the channel region 213. Consequently, during the subsequent anneal process 230, performed on the basis of the respectively patterned optical characteristics of the device 200, an even further enhanced strain-inducing mechanism may be achieved. Thereafter, the absorption layer 204 may be removed, for instance on the basis of an anisotropic etch process, in order to maintain a portion of the stressed material of the absorption layer 204.

Figure 2F:
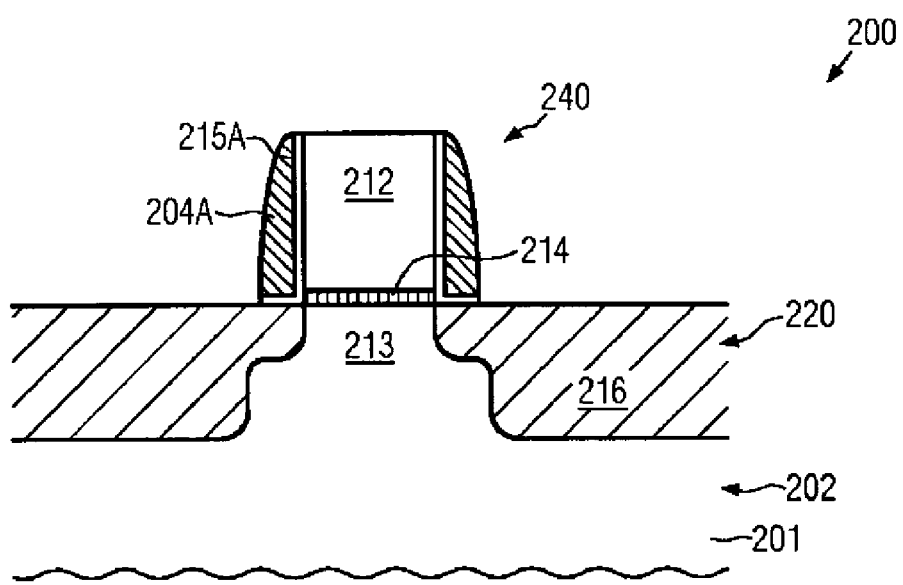
FIGS. 2f-2h schematically illustrate cross-sectional views to illustrate the enhancement of the strain-inducing effect during an anneal process with different effects in a transistor according to further illustrative embodiments.

FIG. 2f schematically illustrates the semiconductor device 200 with respective stressed sidewall spacers 204A, which may correspondingly enhance the corresponding "stress memorization" effect for the device 200, since the corresponding strained state of the drain and source regions 216, and thus of the channel region 213, may be conserved in an even more enhanced manner due to the presence of the stressed sidewall spacers 204A. Furthermore, the sidewall spacers 204A may be used in a subsequent silicidation process for providing a high degree of process compatibility with conventional silicidation regimes, in which the respective sidewall spacers may provide the self-aligned characteristics of the silicidation process.

Figure 2G:
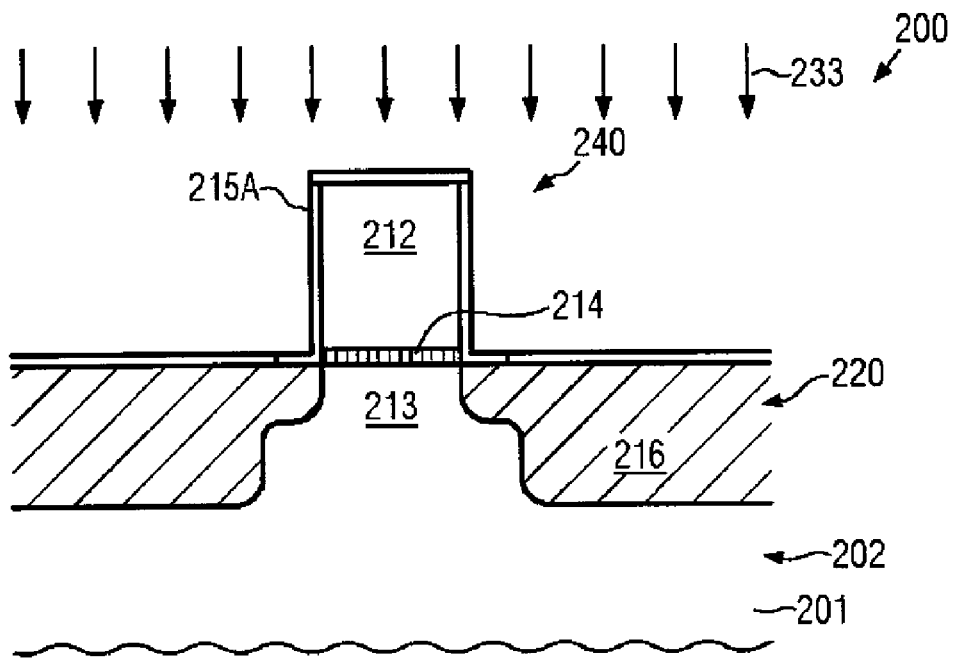

FIG. 2g schematically illustrates the semiconductor device 200 in accordance with yet further illustrative embodiments. In these embodiments, the sidewall spacer structure 215 may be removed or may be maintained (not shown) depending on the process strategy, wherein an additional implantation process 233 may be performed on the basis of an appropriate ion species in order to substantially completely amorphize the drain and source regions 216 in order to enhance the subsequent re-crystallization process during the anneal process 230.

Figure 2H:
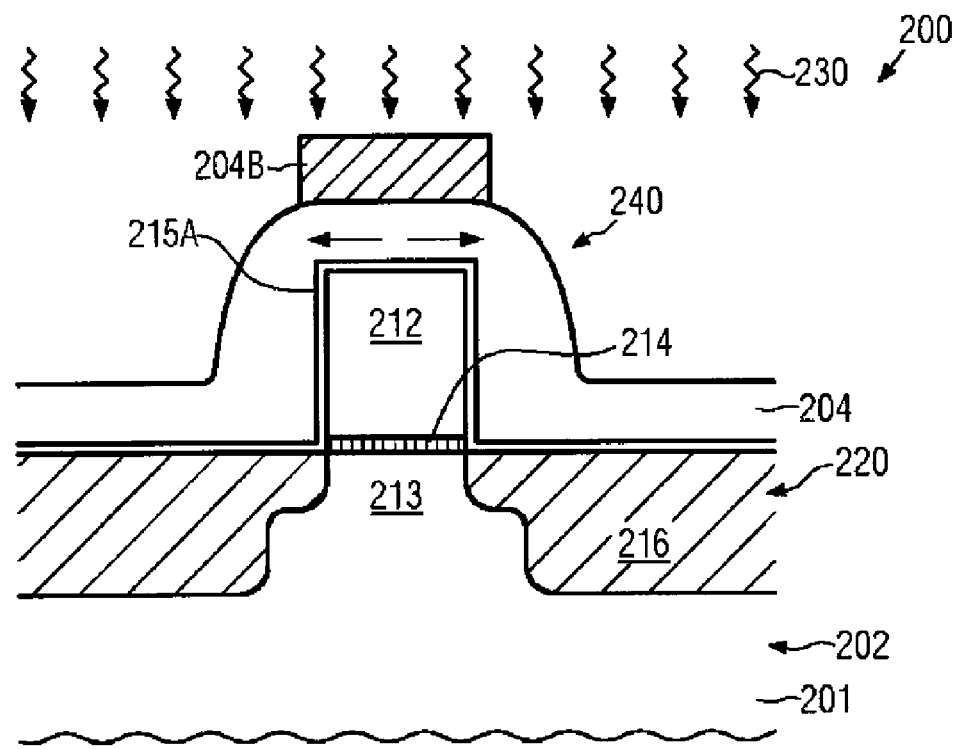

FIG. 2h schematically illustrates the device 200 in a further advanced manufacturing stage, wherein the absorption layer 204 is formed in a highly stressed state, as previously described, wherein, upon activating the dopants on the basis of the anneal process 230, a corresponding increased strained state of the re-grown drain and source regions may be obtained, thereby also increasing the respective strain in the channel region 213. Thereafter, the absorption layer 204 may be removed or, in other illustrative embodiments, sidewall spacers thereof may be maintained, as is previously described, so as to maintain a higher degree of strain created during the re-crystallization process based on the preceding amorphization implantation 233.

Figure 2I:
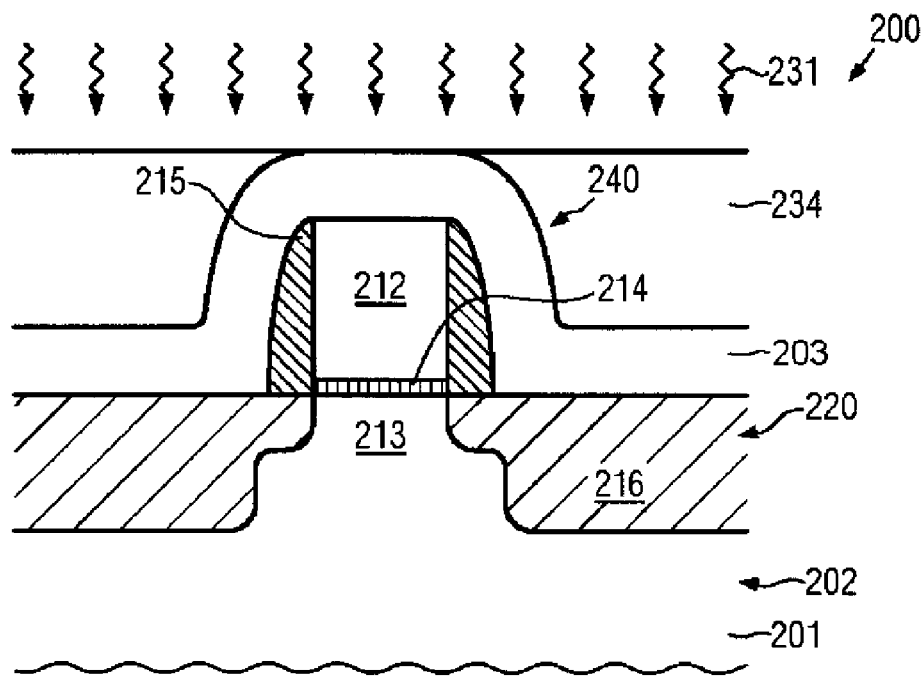
FIGS. 2i-2j schematically illustrate cross-sectional views of a transistor element during the formation of a metal silicide and a subsequent activation process with different efficiency in different transistor regions according to further illustrative embodiments.

FIG. 2i schematically illustrates the semiconductor device 200 according to a further illustrative embodiment, in which the drain and source regions 216 may still be in a highly amorphized state and a corresponding metal layer 203 of a refractory metal may be formed above the transistor 240. For this purpose, any appropriate deposition technique may be used in combination with a desired refractory metal, such as nickel, in order to provide the desired type of metal silicide in the drain and source regions 216 and the gate electrode 212. Next, the anneal process 231, as previously described with reference to FIG. 2b, may be performed in order to convert the metal into metal silicide, wherein, as previously explained, in some illustrative embodiments, the process 231 may comprise sophisticated laser-based or flash-based anneal techniques. In some illustrative embodiments, a respective absorption layer 234 may be formed, if the optical characteristics of the metal layer 203 are deemed inappropriate. In other cases, as is shown in FIG. 2i, the layer 234 may be provided as an anti-reflective coating (ARC) so as to enhance the reflectivity above the drain and source regions 216 while providing enhanced absorption capabilities above the gate electrode 212 in order to provide increased metal silicide formation therein. In still other illustrative embodiments, the anneal process 231 may represent any conventional process technique, wherein, also in this case, the substantially amorphous state of the drain and source regions 216 may provide increased process uniformity during the chemical reaction between the metal and the silicon, thereby also contributing to reduced metal silicide defects, as are previously described with reference to the device 100.

Figure 2J:
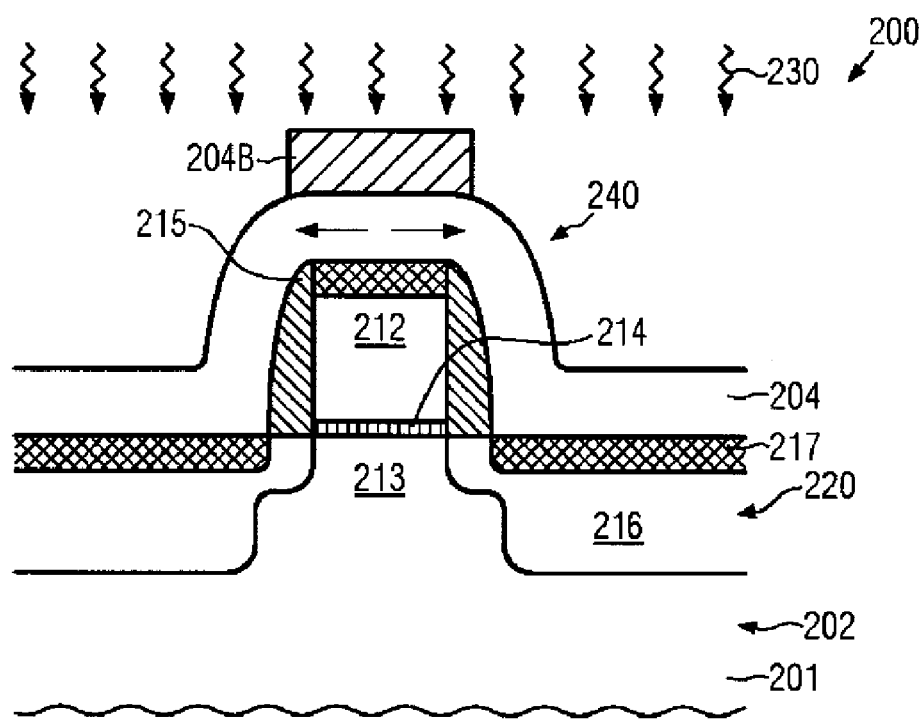

FIG. 2j schematically illustrates the device 200 of FIG. 2i in a further advanced manufacturing stage. Respective metal silicide regions 217 may be formed in the drain and source regions 216 and the gate electrode 214 on the basis of the previously described process sequence, and the absorption layer 204 may be provided in combination with a corresponding configuration so as to provide a different optical response with respect to the gate electrode 212 and the drain and source regions 216, for instance on the basis of a cover portion 204B or any other appropriate patterning configuration as previously described, or as described later on. The device 200 as shown may be subjected to the anneal process 230, wherein the substantially amorphous drain and source regions 216 may be efficiently re-crystallized while also activating the corresponding dopants, wherein, additionally, a further thermal stabilization of the metal silicide regions 217 may be obtained. For this purpose, the preceding anneal process 231 may substantially correspond to a metal silicide formation process, while the anneal process 230 may provide the required thermal modification of the metal silicide, such as an additional thermal stabilizing step and the like.

It should be appreciated that, in the embodiments described so far, the respective activation of dopants within the gate electrode 212 may be less pronounced due to the efficient patterning of the optical response with respect to the specified wavelength range during the anneal process 230. Consequently, in some illustrative embodiments, an appropriate anneal process may be specifically designed for activating dopants in the gate electrode 212 and also to re-establish the substantially polycrystalline structure thereof. However, as previously explained, the corresponding anneal temperature may be selected to be less in order to avoid undue damage in the vicinity of the gate insulation layer 214. Consequently, a corresponding anneal process on the basis of laser or flash anneal systems may be performed prior to or after the corresponding activation process 230 for activating the dopants in the drain and source regions 216 on the basis of higher temperatures, wherein a corresponding anneal sequence with a low temperature may not significantly affect the dopant activation in the drain and source regions 216. That is, when a corresponding "non-patterned" anneal process may be performed with appropriate process parameters prior to the activation process for the drain and source regions 216 so as to establish reduced temperatures, a certain degree of dopant activation may also occur in the drain and source regions 216, which may not negatively affect the subsequent anneal process 230 performed at a very high temperature, wherein the corresponding reduced energy deposition in the gate electrode 212 may reduce the risk of any gate insulation layer defects, as previously described. In other cases, a corresponding further anneal step may be performed at a reduced temperature without using a patterning configuration as applied during the previously performed anneal process 230, thereby nevertheless obtaining a desired degree of dopant activation in the gate electrode 212, while not affecting the drain and source regions 216.

Figure 2K:
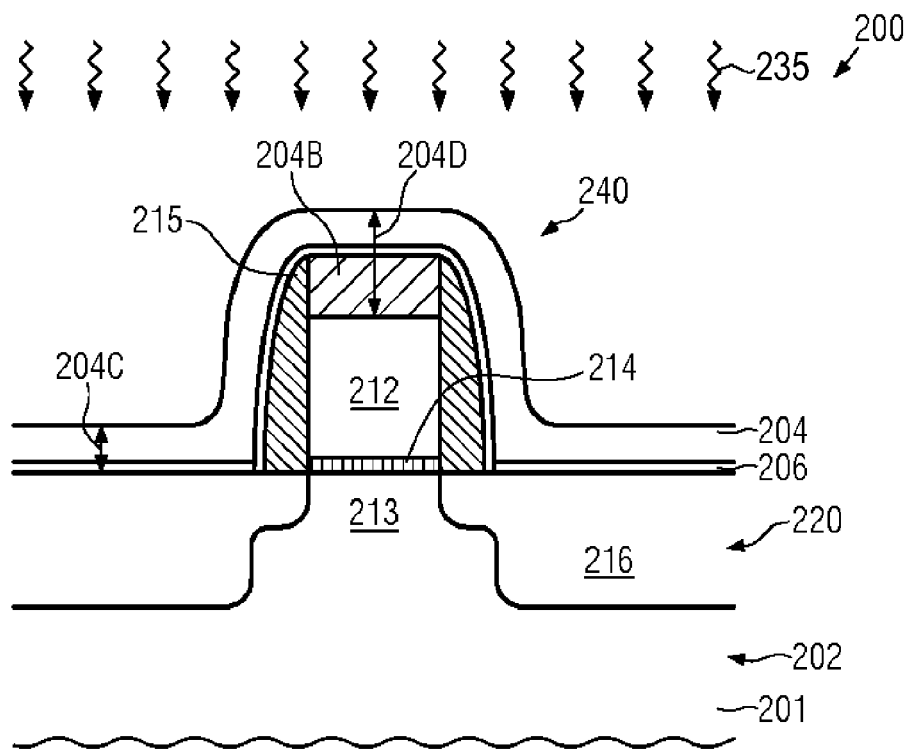
FIGS. 2k-2l schematically illustrate cross-sectional views for forming an efficient anneal mask above a gate electrode of a transistor according to still further illustrative embodiments.
Figure 2L:
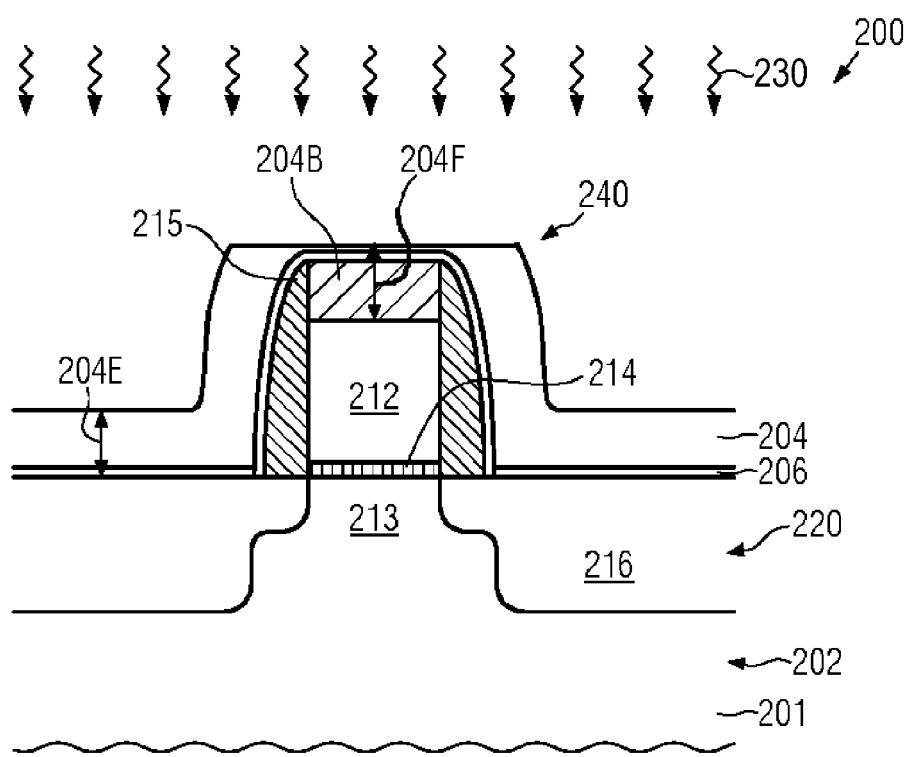

With reference to FIGS. 2k-2l, further illustrative embodiments will now be described, in which a self-aligned cap layer for the gate electrode 212 may be provided, which may, in some illustrative embodiments, additionally be combined with a respective implantation sequence for appropriately depositing the dopants in the gate electrode 212 while not unduly affecting the further process sequence for forming the drain and source regions 216.

FIG. 2k schematically illustrates the semiconductor device 200 with a cap layer 204B formed on the gate electrode 212, wherein, additionally, the layer 204 may be provided with an appropriate thickness 204C which may provide, in combination with the cap layer 204B, a moderately high amount of absorption for a correspondingly selected wavelength range of an anneal process 235. In some illustrative embodiments, the absorption layer 204 may be formed above a corresponding etch stop layer 206 in order to facilitate the subsequent removal of the layer 204 for the further processing of the device 200.

The device 200 as shown in FIG. 2k may be formed on the basis of the following processes. The gate electrode 212 and the gate insulation layer 214 may be formed on the basis of well-established techniques, as previously described, wherein a corresponding ARC layer may be provided so as to enhance the photolithography process. Contrary to conventional strategies, the respective ARC layer may be maintained and may represent the cap layer 204B. Furthermore, in some illustrative embodiments, prior to providing the respective ARC layer on top of the corresponding gate electrode material, this gate electrode material may be provided with a high dopant concentration of an appropriate conductivity type, which may be accomplished on the basis of well-established implantation techniques. Hence, the gate electrode 212 may have the required high dopant concentration so that any shadowing effects of the cap layer 204B in subsequent implantation processes may not negatively influence the overall conductivity of the gate electrode 212. After patterning the gate electrode 212 including the cap layer 204B, the further processing may be continued as previously described. It should be appreciated that the thickness of the cap layer 204B may be selected in accordance with requirements imposed by the corresponding photolithography process for patterning the gate electrode 212. Hence, the thickness of the cap layer 204B may not completely avoid the penetration of ion species during subsequent implantation processes, thereby possibly resulting in a certain damage of the crystalline structure of the gate electrode 212, even if a corresponding laser-based or flash-based anneal process may have been performed prior to or after the patterning of the gate electrode 212. Thus, in some illustrative embodiments, in addition to any appropriately designed anneal processes for activating dopants in the gate electrodes 212 and re-crystallizing the polycrystalline structure, a specific anneal process 235 may be performed after any implantation sequences for forming the drain and source regions 216, possibly including any amorphization implantations. For this purpose, the cap layer 204B may be used as an absorption layer, wherein, however, the thickness thereof may not be appropriate for the wavelength range used during the anneal process 235. Consequently, the layer 204 may be designed such that a combined thickness and material composition of the layers 204 and the cap layer 204B may provide a high degree of absorption in order to obtain an efficient activation and re-crystallization process. Thus, the corresponding absorption effect of the layer 204 above the drain and source regions 216 may be significantly reduced, thereby possibly restricting the corresponding efficiency of the anneal process 235, which may be advantageous when the drain and source regions 216 are still in a substantially amorphous state in order to enhance subsequent process steps. Hence, during the activation process 235, dopants in the gate electrode 212 may be activated while, depending on the characteristics of the layer 204, a significantly reduced effect may be obtained in the drain and source regions 216.

FIG. 2l schematically illustrates the device 200 in a further advanced manufacturing stage. Here, the absorption layer 204 may be provided with an appropriate thickness 204E in order to obtain the desired absorption behavior above the drain and source regions 216, while the combined thickness of the layer 204 and the cap layer 204B, indicated as 204F, may provide reduced absorption above the gate electrode 212. For instance, in some illustrative embodiments, the cap layer 204 as shown in FIG. 2k may be increased in thickness by an appropriately designed deposition process, while, in other embodiments, the layer 204 of FIG. 2k may be removed and may be replaced by the layer 204 of FIG. 2l. The thickness and the material composition of the layer 204 may be selected such that, for instance, the cap layer 204B may act as an anti-reflective coating with respect to the corresponding wavelength range of the anneal process 230, thereby providing the desired reduced energy deposition in the gate electrode 212 and in the vicinity of the gate insulation layer 214. For this purpose, the thickness of the layer 204 may have to be reduced above the gate electrode 212, which may be accomplished on the basis of a CMP or an etch process, which includes the deposition of an additional planarization layer (not shown). Consequently, a high degree of dopant activation may be obtained in the gate electrode 212 during the previous anneal process and the corresponding optical patterning of the device 200 may be accomplished in a highly self-aligned fashion with a high degree of compatibility with conventional process techniques. It should further be appreciated that the absorption layer 204 as shown in FIG. 2l may also be provided with a high degree of intrinsic stress, as previously described, in order to re-crystallize the drain and source regions 216 in a strained state. Since the preceding anneal process 235 may be performed with significantly reduced effect on the drain and source regions 216, a highly amorphous state may still be provided during the anneal process 230, thereby providing enhanced efficiency of a corresponding strain-inducing mechanism. Furthermore, even if a surface re-crystallization may have been achieved during the preceding anneal process 235 in the drain and source regions 216, a corresponding amorphization implantation may be performed substantially without significantly affecting the gate electrode 212, since the cap layer 204B may efficiently block any implanted ion species designed to substantially amorphize a near-surface portion of the drain and source regions 216 for enhancing the further processing. Thereafter, the layer 204, the etch stop layer 206 and the cap layer 204B may be removed and the further processing may be continued by forming respective metal silicide regions, if required.

It should be appreciated that, in some illustrative embodiments, the corresponding absorption layer 204, when provided prior to the formation of metal silicide regions, may only be removed from device portions which require metal silicide and may be maintained in other device regions, in which a respective metal silicide may not be required.

Figure 2M:
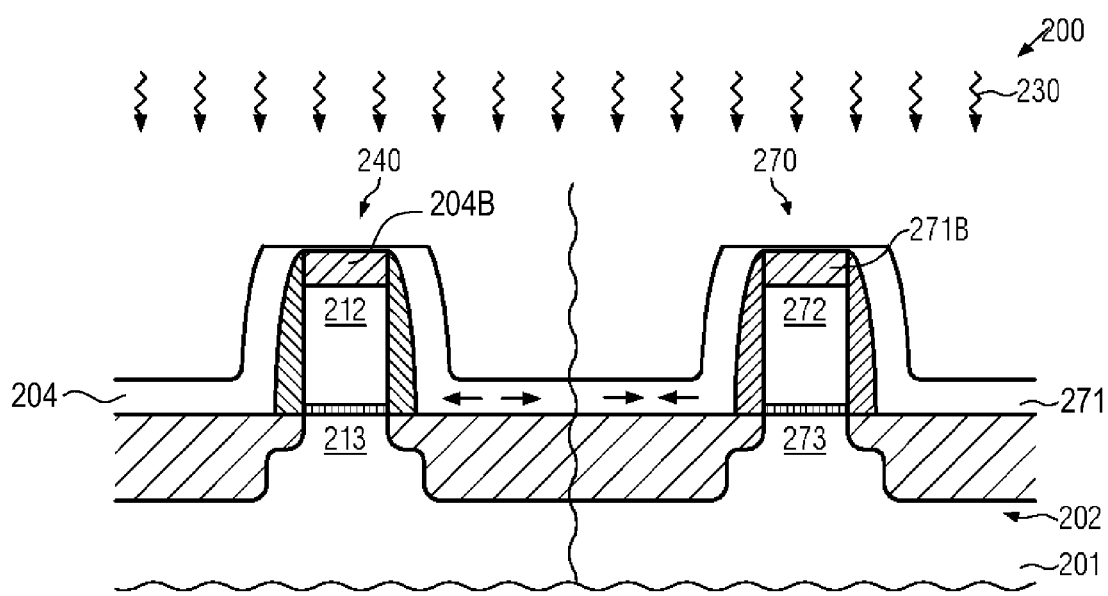
FIG. 2m schematically illustrates a cross-sectional view of different types of transistors receiving stressed overlayers during an anneal process according to still further illustrative embodiments.

FIG. 2m schematically illustrates the semiconductor device 200 in accordance with further illustrative embodiments, in which the transistor 240 and a second transistor 270 may be provided and may be subjected to the anneal process 230 on the basis of a respective stressed absorption layer 204 for the transistor 240 and an absorption layer 271 for the transistor 270. Furthermore, a corresponding adjustment of the optical responses of the transistors 240, 270 may be obtained on the basis of respective measures, such as capping layers 204B and 271B or any other mechanisms as previously described. The transistors 240 and 270 may represent transistors of different conductivity type, which may require a different type of strain in the respective channel regions. For this purpose, the absorption layer 204 may be provided with a high intrinsic stress appropriate for creating a desired type of strain in the transistor 240, while the type of intrinsic stress in the layer 271 may provide a different type of strain in the respective channel region of the transistor 270. Thus, upon performing the anneal process 230, the corresponding drain and source regions of the transistors 240, 270 may be re-crystallized in a strained state, thereby providing the desired type of strain in the respective channel regions.

As a result, the subject matter disclosed herein provides a technique for enhancing transistor characteristics in a highly localized manner by using sophisticated anneal techniques, such as laser-based and flash-based anneal processes, wherein the process parameters of the corresponding anneal processes and/or the optical response of respective device regions may be appropriately adjusted in order to obtain different anneal results in the device regions. In some illustrative embodiments, the metal silicide formation process may be enhanced by locally varying the anneal conditions, while, in other illustrative embodiments, the activation and re-crystallization of semiconductor areas may be performed in a highly localized manner, wherein different anneal conditions may be created in the vicinity of a gate insulation layer and in drain and source regions of a single transistor element. Consequently, a reduced pattern sensitivity and parameter fluctuation may be achieved during the manufacturing sequence of sophisticated semiconductor devices. Furthermore, enhanced charge carrier mobility in respective channel regions may be obtained, while nevertheless an improved reliability of the gate insulation layer may be maintained, wherein at the same time the dopant activation may be improved while, additionally, increased process uniformity for metal silicidation processes may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    selectively modifying at least one surface characteristic of a first device region and a second device region of a semiconductor device to provide different optical responses in said first and second device regions when irradiated by a radiation of a specified wavelength range;
    after selectively modifying said at least one surface characteristic, forming a first metal silicide in said first device region at a first reaction temperature created by irradiating said first device region by said radiation of said specified wavelength range; and
    forming a second metal silicide in said second device region at a second reaction temperature created by irradiating said second device region by said radiation of said specified wavelength range, said first temperature being less than said second temperature, wherein irradiating said first and second device regions comprises irradiating said first and second device regions with a beam of said radiation, and wherein each surface portion irradiated by said beam is irradiated for a time interval of 0.1 seconds or less.

2. The method of claim 1, wherein said first and second metal silicide regions comprise nickel.

3. The method of claim 1, wherein said first and second temperatures are obtained by using different time intervals in said first and second device regions.

4. The method of claim 1, wherein said first device regions comprises a transistor element of an SRAM cell.

5. The method of claim 1, wherein modifying said surface characteristics comprises providing a material layer of specified optical properties in at least one of said first and second device regions to obtain said different optical response.

6. The method of claim 5, wherein said material layer is formed in said first and second device regions and is selectively reduced in thickness in one of said first and second device regions.

7. The method of claim 6, wherein said material layer comprises a refractory metal.

8. A method, comprising:
    selectively modifying at least one surface characteristic of a first device region and a second device region of a semiconductor device to provide different optical responses in said first device region and said second device region to a specified wavelength range of radiation, wherein said first device region represents a gate electrode of a transistor and said second device region represents at least a portion of a drain and source region of said transistor;
    prior to selectively modifying said at least one surface characteristic of said first and second device regions, substantially amorphizing a portion of said second device region; and
    after selectively modifying said at least one surface characteristic, irradiating said first and second device regions with a beam of said radiation to initiate a dopant activation process in said first and second device regions, wherein each surface portion irradiated by said beam is irradiated for a time interval of approximately 1 microsecond or less.

9. The method of claim 8, further comprising initiating a second dopant activation process for activating dopants in said first device region.

10. The method of claim 8, wherein modifying surface characteristics comprises forming a first material layer above said first device region and a second material layer above said second device region, said first material layer having a reduced absorption capability compared to said second material layer with respect to said wavelength range.

11. The method of claim 10, wherein said specified dopant species is boron.

12. The method of claim 10, wherein modifying surface characteristics comprises forming a reflective material layer above said first device region.

13. The method of claim 12, wherein modifying surface characteristics comprises forming a first stressed material layer above said first and second device regions, selectively reducing an absorption capability of said first stressed material layer in said first device region and initiating said dopant activation process in the presence of said stressed material layer.

14. The method of claim 13, wherein said semiconductor device comprises a third device region and a fourth device region and said method further comprises forming a second stressed material layer above said third and fourth device regions, said second stressed material layer having a different type of stress relative to said first stressed material layer.

15. A method, comprising:
preparing a first device region and a second device region of a semiconductor device so as to provide different optical responses in said first and second device regions to radiation of a specified wavelength range;
prior to preparing said first and second device regions so as to provide different optical responses, substantially amorphizing a portion of at least one of said first and second device regions; and
after preparing said first and second device regions so as to provide different optical responses to said radiation of said specified wavelength range, annealing each surface portion of said first and second device regions for a time interval of 1 microsecond or less by at least one of a laser anneal process and a flash anneal process using a beam of said radiation of specified wavelength to initiate at least one of a silicidation process and a dopant activation process in said first and second device regions.

16. The method of claim 15, wherein said first device region represents a transistor of an SRAM cell.

17. The method of claim 15, wherein said first device region represents a gate electrode of a transistor and said second device region represents drain and source regions of said transistor.

* * * * *